US012745377B2

(12) United States Patent
Payne

(10) Patent No.: US 12,745,377 B2
(45) Date of Patent: Sep. 22, 2026

(54) HIGH VOLTAGE COVER FOR JUNCTION BOX

(71) Applicant: Schaeffler Technologies AG & Co. KG, Herzogenaurach (DE)

(72) Inventor: Matthew Payne, Glenmont, OH (US)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 10 days.

(21) Appl. No.: 18/883,059

(22) Filed: Sep. 12, 2024

(65) Prior Publication Data

US 2026/0075784 A1 Mar. 12, 2026

(51) Int. Cl.
*H05K 9/00* (2006.01)
*B60R 16/02* (2006.01)
*H02G 3/08* (2006.01)

(52) U.S. Cl.
CPC .......... *H05K 9/0015* (2013.01); *B60R 16/02* (2013.01); *H02G 3/081* (2013.01)

(58) Field of Classification Search
CPC .......................... H05K 5/0213; H05K 9/0015
See application file for complete search history.

(56) References Cited

U.S. PATENT DOCUMENTS 7,420,771 B1 * 9/2008 Hanke ................ G11B 33/1466 360/99.18
2007/0278909 A1 * 12/2007 Xu ....................... G11B 33/025
2020/0113071 A1 * 4/2020 Arnhold ............... H05K 5/0217
2023/0406243 A1 * 12/2023 Baydoun ............. H05K 9/0045
2024/0386909 A1 * 11/2024 Ito ......................... G11B 5/531

* cited by examiner

*Primary Examiner* — Hung V Ngo
(74) *Attorney, Agent, or Firm* — Volpe Koenig

(57) ABSTRACT

An electromagnetic compatible enclosure, for example, a junction box of an electric or hybrid vehicle, having a housing having a cavity, a cover secured to the housing with a plurality of fasteners, the cover enclosing the cavity. The cover includes a metal plate and a polymer body fixed to the metal plate.

21 Claims, 4 Drawing Sheets

HIGH VOLTAGE COVER FOR JUNCTION BOX

TECHNICAL FIELD

The present disclosure relates to junction box assemblies and, more particularly, to junction box assemblies for electric vehicles.

BACKGROUND

Junction box assemblies are generally well known in electric motor (e-motor) applications. A junction box assembly is generally configured to transfer power from the power electronics unit (PEU) to the e-motor through phase bars. Many junction box assemblies include a housing having a cavity and a cover attached to the housing enclosing the cavity. For electromagnetic compatibility (EMC), junction box assemblies also provide faraday cage shielding. As such, the cover is typically a cast and machined metal component joined to the housing with a plurality of spaced-apart fasteners, such as bolts or screws. To ensure proper electromagnetic shielding, the fasteners are spaced at specific intervals that ensure proper contact between the housing and the cover.

SUMMARY

Aspects of the present disclosure are directed to an electromagnetic compatible enclosure comprising a housing having a cavity, a cover secured to the housing with a plurality of fasteners, the cover enclosing the cavity. The cover includes a metal plate and a polymer body fixed to the metal plate.

The metal plate is configured to engage a flange of the housing. The polymer body can include a sealing flange having a circumferential groove in which a sealing element is received. A vent can be supported by the polymer body. The vent can be received in an opening in the metal plate. The vent can have a height that is equal or less than a thickness of the metal plate. The polymer body can be fixed to the metal plate with at least one heat stake. The metal plate can include at least one of an aluminum stamped plate or a steel stamped plate. The polymer body can be a molded component. The metal plate can extend beyond the polymer body along an entire outer perimeter of the polymer body.

In accordance with another aspect, a cover for an electromagnetic compatible enclosure comprises a metal plate and a polymer body fixed to the metal plate. The metal plate is configured to engage a flange of the housing. The polymer body can include a sealing flange having a circumferential groove in which a sealing element is received. A vent can be supported by the polymer body. The vent can be received in an opening in the metal plate. The vent can have a height that is equal or less than a thickness of the metal plate. The polymer body can be fixed to the metal plate with at least one heat stake. The metal plate can include at least one of an aluminum stamped plate or a steel stamped plate. The polymer body can be a molded component. The metal plate can extend beyond the polymer body along an entire outer perimeter of the polymer body.

BRIEF DESCRIPTION OF THE DRAWING(S)

The foregoing Summary and the following Detailed Description will be better understood when read in conjunction with the appended drawings, which illustrate a preferred embodiment of the disclosure. In the drawings.

DETAILED DESCRIPTION OF THE PREFERRED EMBODIMENT(S)

Figure 1:
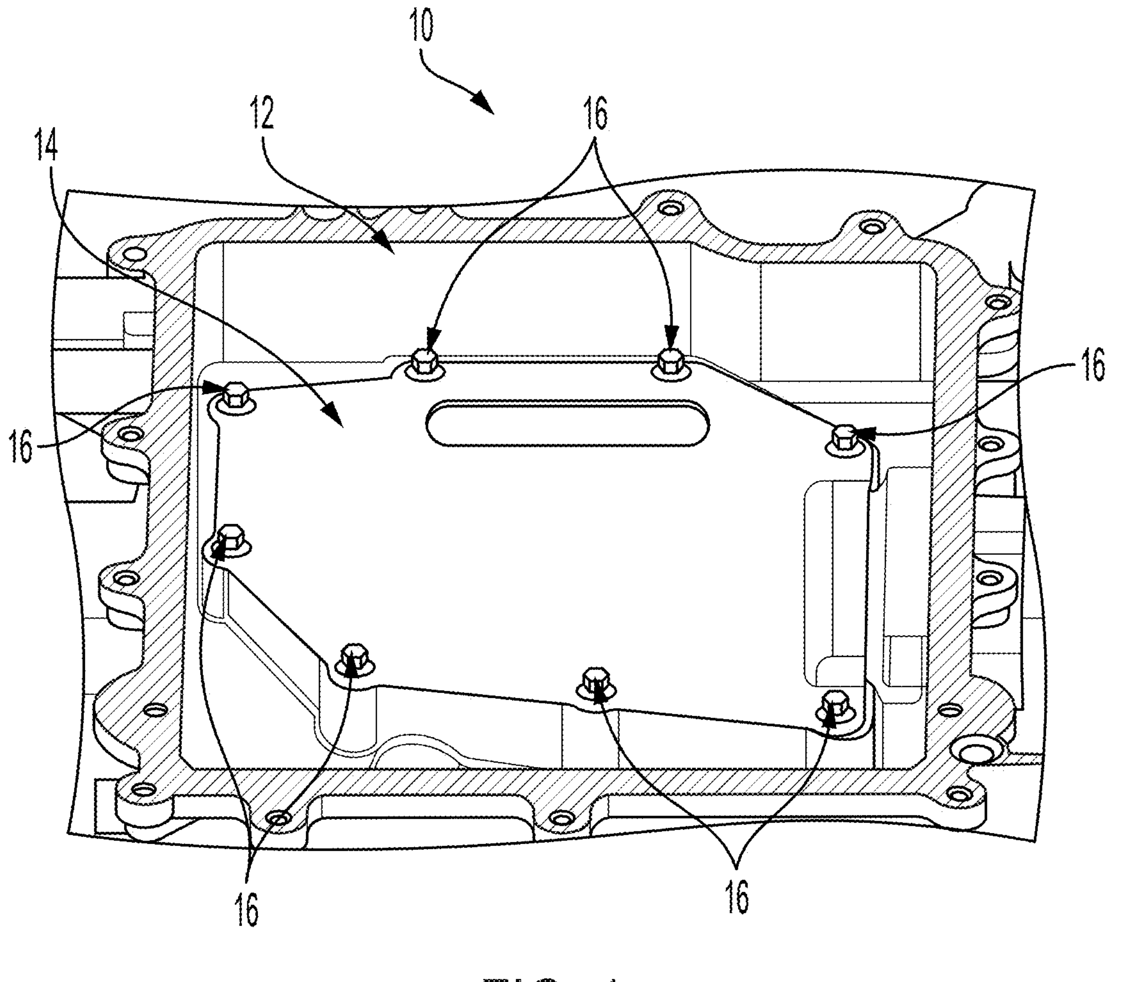
FIG. 1 is a perspective view of a prior art junction box assembly.

Certain terminology is used in the following description for convenience only and is not limiting. The words "front," "rear," "upper" and "lower" designate directions in the drawings to which reference is made. The words "inwardly" and "outwardly" refer to directions toward and away from the parts referenced in the drawings. "Axially" refers to a direction along the axis of a shaft. A reference to a list of items that are cited as "at least one of a, b, or c" (where a, b, and c represent the items being listed) means any single one of the items a, b, or c, or combinations thereof. The terminology includes the words specifically noted above, derivatives thereof and words of similar import.

In FIG. 1, a conventional junction box assembly is illustrated and identified generally by reference numeral 10. The junction box assembly includes a housing 12 and a metal cover 14 secured to the housing with a plurality of fasteners in the form of bolts 16. The bolts 16 extend through openings in the cover 14. Although not shown, a person of skill in the art will understand that the cover 14 encloses a cavity of the housing 12, and electrical components, such as bus bars, are often contained in the cavity.

The bolts 16 are generally evenly spaced-apart about a periphery of the cover 14 to ensure proper contact between the cover 14 and the housing 12 for EMC purposes. However, the two bolts 16 on the right side of the cover 14 are spaced-apart a greater distance than the rest of the bolt 16. It should be noted that the design constraints of the housing 12 make it difficult to provide proper spacing of the bolts along the right side of the cover 14. As such, the junction box assembly 10 may not achieve a desired EMC in all instances or, alternatively, redesign of the junction box assembly would be required to add an additional fastener between the bolts 16 on the right side of the cover. The former option is not ideal and the latter option increases cost, weight and assembly times.

Figure 2:
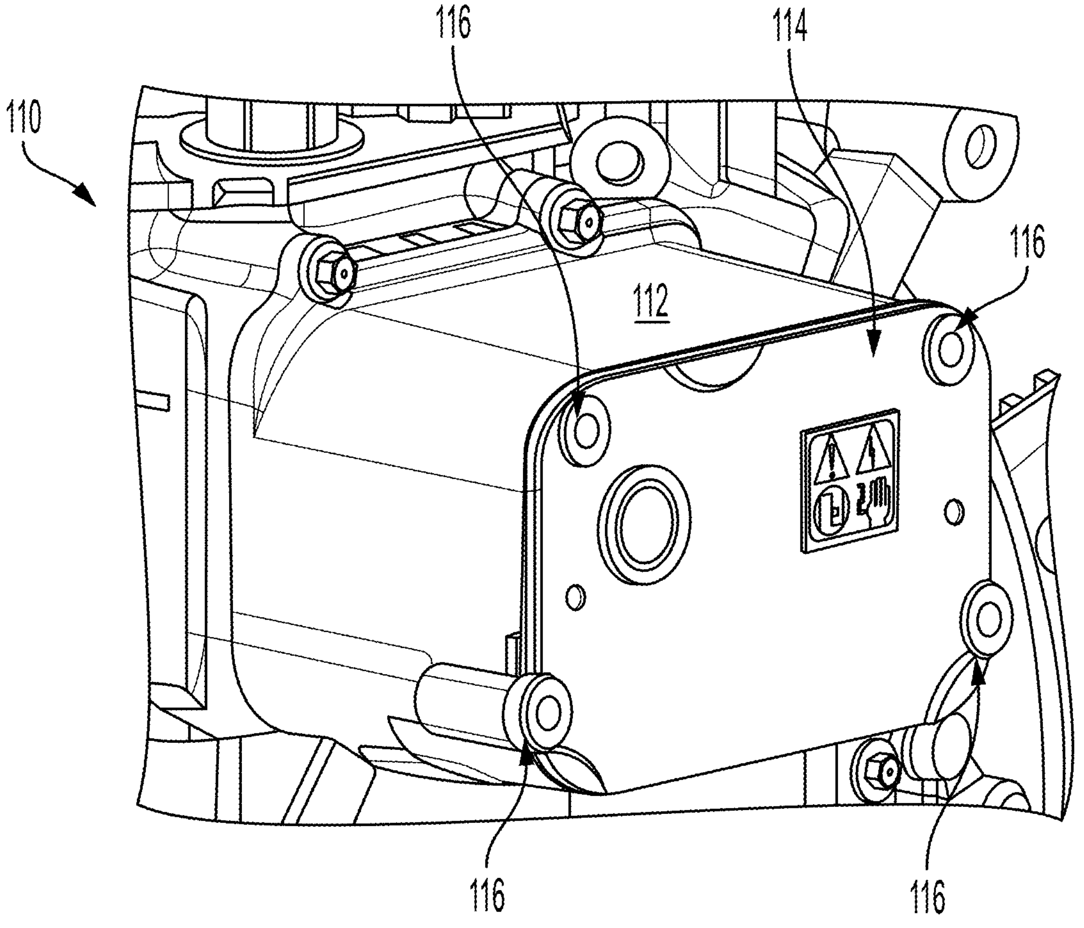
FIG. 2 is a perspective view of an exemplary junction box assembly including a cover in accordance with the present disclosure.
Figure 3:
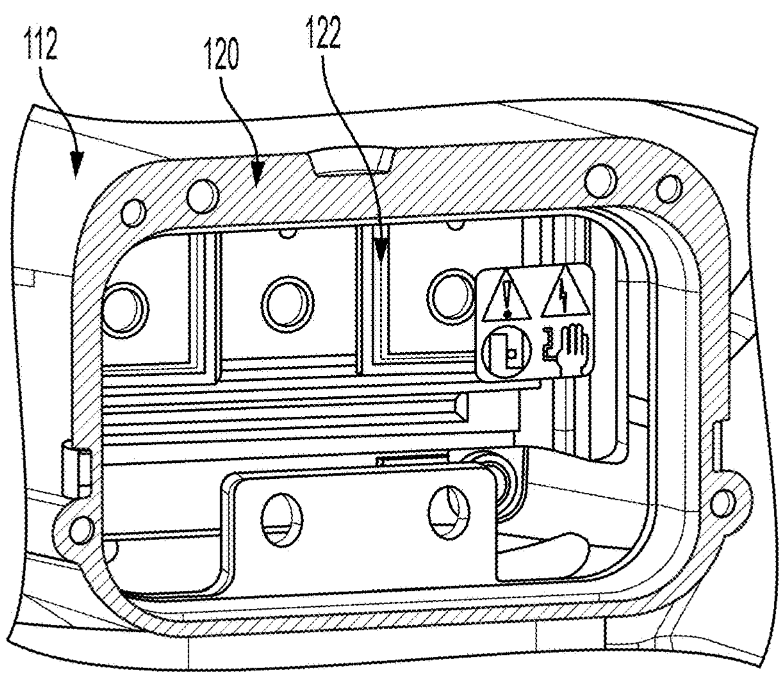
FIG. 3 is a perspective view of the junction box assembly of FIG. 2 with the cover removed.
Figure 4:
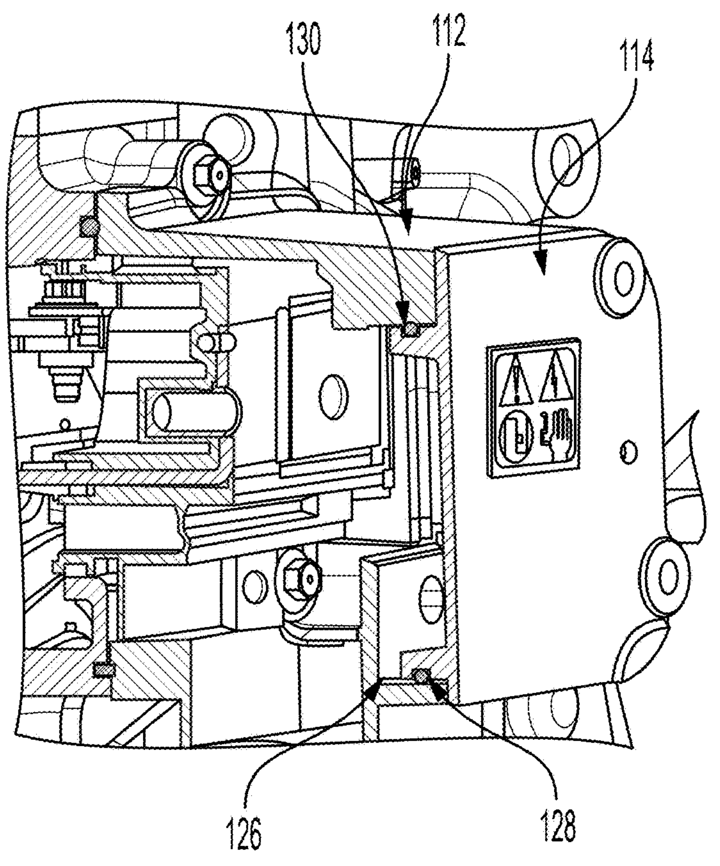
FIG. 4 is a perspective cross-sectional view of the junction box assembly of FIG. 2.

Turning to FIGS. 2-4, an exemplary junction box assembly is illustrated and identified generally by reference numeral 110. The junction box assembly 110 includes a housing 112 and a cover 114 secured to the housing with a plurality of fasteners in the form of bolts 116. The bolts 116 extend through openings in the cover 114 into a flange 120 of the housing surrounding a cavity 122 of the housing 112. The cavity 122 of the housing 112 can contain, for example, electrical components, such as bus bars, etc.

In FIG. 3, the cover 112 is removed and it can be seen that the particular configuration of the housing 112 leaves little area for axial face sealing between the cover 114 and the housing 112. Accordingly, the cover 114 is configured to seal on an inner circumferential surface of the housing 112. In this regard, the cover 112 includes a sealing flange 126 having a circumferential groove 128 for receiving a seal element 130. In the context of this disclosure, the term "circumferential" is relative to a central axis extending normal to a plane of the cover 114. While the cover 112 in FIGS. 2 and 4 is suitable for most applications, it typically requires a substantial amount of machining to form the flange, circumferential groove, etc.

Figure 5:
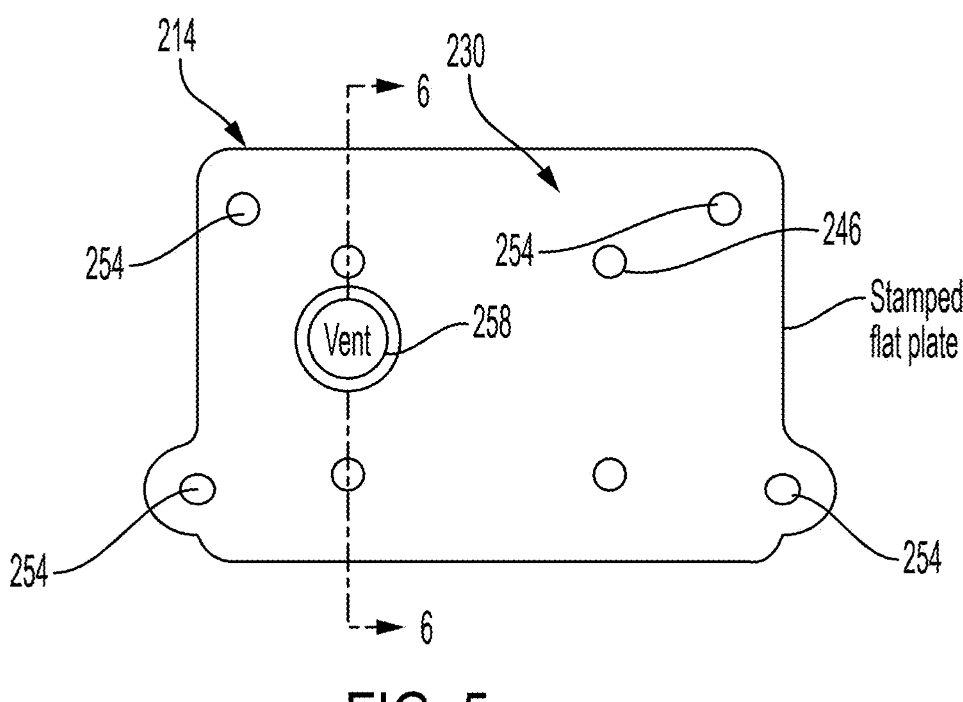
FIG. 5 is a plan view of another exemplary cover for the junction box assembly of FIG. 2.
Figure 6:
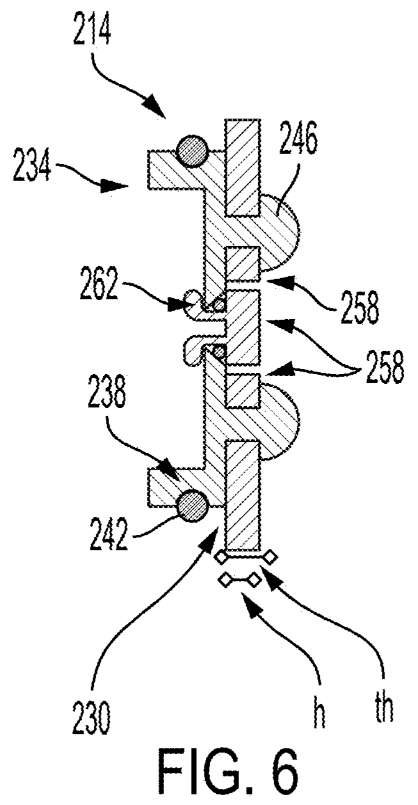
FIG. 6 is a cross-sectional view of the cover taken along the line A-A in FIG. 5.

Turning to FIGS. 5 and 6, an exemplary cover in accordance with the present disclosure is illustrated and identified generally by reference numeral 214. It will be appreciated that the cover 214 can be used in place of the cover 114 in the junction box assembly 110 of FIG. 2. The cover 214 is comprised of two main components, a metal plate 230 for ensuring EMC and a polymer body 234 coupled to the metal plate 230. The polymer body 234 includes a circumferential groove 238 in which a sealing element 242 is supported for sealing on an inner surface of the housing 112. The polymer body 234 is coupled to the metal plate 230 via heat staking wherein stakes 246 of the polymer body 234 are received in respective holes 250 of the metal plate 230. The cover 214 includes bolt holes 254 for securing the cover 114 to the housing 112. In addition, a vent 258 is installed in a vent hole 262 of the polymer body 234. The vent 258 is recessed in a vent opening in the metal plate 230 to prevent it from being damaged during handling. In this regard, the vent 258 has a height H that is equal or less than a thickness TH of the metal plate 230.

In some embodiments, the metal plate 230 can be a stamped aluminum or steel component. The polymer body 234 can be a molded component wherein the circumferential groove 238, bolt holes 254 and vent hole 262 are formed in a single process. The metal plate 230 extends beyond a peripheral edge of the polymer body 234 for engagement (e.g., metal-to-metal contact) with the flange 120. The polymer body 234 extends into the cavity 122 and the sealing element 242 seals against in interior surface of the housing 112. The two component construction of the cover 214 eliminates the machining steps required for producing other covers (e.g., cover 114), while still providing EMI protection via the metal plate 230.

Further, it should be appreciated that aspects of the disclosure are applicable to a wide range of enclosures. Although the exemplary embodiments relate to junction box assemblies, aspects of the disclosure can be used in connection with any enclosure where electromagnetic compatibility is desired.

It will now be appreciated that aspects of the present disclosure allow greater flexibility while decreasing weight, costs and assembly time.

LOG OF REFERENCE NUMERALS

10 conventional junction box assembly
12 housing
14 cover
16 bolts
110 junction box assembly
112 housing
114 cover
116 bolts
120 flange
122 cavity
214 cover
230 plate
234 polymer body
238 circumferential groove
242 sealing element
246 stakes
250 holes
254 holes
258 vent
262 vent hole

What is claimed is:

1. An electromagnetic compatible enclosure comprising:
a housing having a cavity;
a cover secured to the housing with a plurality of fasteners, the cover enclosing the cavity;
wherein the cover includes a metal plate and a polymer body fixed to the metal plate;
wherein the polymer body includes a sealing flange extending into the cavity having a circumferential groove in which a sealing element is received for sealing against an inner surface of the housing within the cavity.

2. The electromagnetic compatible enclosure according to claim 1, wherein the metal plate is configured to engage a flange of the housing.

3. The electromagnetic compatible enclosure according to claim 1, further comprising a vent supported by the polymer body.

4. The electromagnetic compatible enclosure according to claim 3, wherein the vent extends into an opening in the metal plate.

5. The electromagnetic compatible enclosure according to claim 4, wherein the vent has a height within the opening in the metal plate that is equal or less than a thickness of the metal plate.

6. The electromagnetic compatible enclosure according to claim 3, wherein the polymer body includes a vent hole through which a first part of the vent extends so that a portion of the first part is disposed in the cavity of the housing, a second part of the vent is disposed on an outer surface of the polymer body and within an opening of the metal plate, and the vent engages with the polymer body.

7. The electromagnetic compatible enclosure according to claim 1, wherein the polymer body is fixed to the metal plate with at least one heat stake.

8. The electromagnetic compatible enclosure according to claim 1, wherein the metal plate includes at least one of an aluminum stamped plate or a steel stamped plate.

9. The electromagnetic compatible enclosure according to claim 1, wherein the polymer body is a molded component.

10. The electromagnetic compatible enclosure according to claim 1, wherein the metal plate extends beyond the polymer body along an entire outer perimeter of the polymer body.

11. The electromagnetic compatible enclosure according to claim 1, wherein the sealing flange has an outer circumferential surface along which the groove is defined.

12. A cover for an electromagnetic compatible enclosure comprising:
a metal plate and a polymer body fixed to the metal plate;
wherein the polymer body includes a sealing flange having an outer circumferential surface with a groove in which a sealing element is received, the sealing flange configured to be received in a cavity of an associated housing for sealing against an inner surface of the associated housing within the cavity.

13. The cover according to claim 12, wherein the metal plate is configured to engage a flange of a housing surrounding a cavity of the enclosure.

14. The cover according to claim 12, further comprising a vent supported by the polymer body.

15. The cover according to claim 14, wherein the vent extends into an opening in the metal plate.

16. The cover according to claim 15, wherein the vent has a height within the opening in the metal plate that is equal or less than a thickness of the metal plate.

17. The cover according to claim 14, wherein the polymer body includes a vent hole through which a first part of the vent extends so that a portion of the first part is disposed in the cavity of the associated housing, a second part of the vent is disposed on an outer surface of the polymer body and within an opening of the metal plate, and the vent is engaged with the polymer body.

18. The cover according to claim 12, wherein the polymer body is fixed to the metal plate with at least one heat stake.

19. The cover according to claim 12, wherein the metal plate includes at least one of an aluminum stamped plate or a steel stamped plate.

20. The cover according to claim 12, wherein the polymer body is a molded component.

21. The cover according to claim 12, wherein the metal plate extends beyond the polymer body along an entire outer perimeter of the polymer body.

* * * * *